United States Patent
Van Der Toorn et al.

(10) Patent No.: US 7,859,644 B2
(45) Date of Patent: **\*Dec. 28, 2010**

(54) LITHOGRAPHIC APPARATUS, IMMERSION PROJECTION APPARATUS AND DEVICE MANUFACTURING METHOD

(75) Inventors: Jan-Gerard Cornelis Van Der Toorn, Eindhoven (NL); Hans Butler, Best (NL); Henrikus Herman Marie Cox, Eindhoven (NL); Evert Hendrik Jan Draaijer, Eindhoven (NL); Nicolaas Ten Kate, Almkerk (NL); Frits Van Der Meulen, Eindhoven (NL); Mark Johannes Hermanus Frencken, Ittervoort (NL); Martijn Houkes, Sittard (NL); Antonius Henricus Arends, Eindhoven (NL); Minne Cuperus, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 441 days.

This patent is subject to a terminal disclaimer.

(21) Appl. No.: 12/000,774

(22) Filed: Dec. 17, 2007

(65) Prior Publication Data
US 2008/0123071 A1 May 29, 2008

Related U.S. Application Data

(63) Continuation of application No. 11/090,699, filed on Mar. 28, 2005, now Pat. No. 7,330,238.

(51) Int. Cl.
*G03B 27/42* (2006.01)
*G03B 27/52* (2006.01)

(52) U.S. Cl. ......................... 355/53; 355/30

(58) Field of Classification Search ............... 355/30, 355/52, 53, 55, 67, 72; 250/548
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Hung Henry Nguyen
(74) *Attorney, Agent, or Firm*—Pillsbury Winthrop Shaw Pittman LLP (57) ABSTRACT

A control system configured to control a position of a fluid supply system, the fluid supply system constructed and arranged to supply a fluid between a substrate and a projection system, the substrate positioned with a substrate stage, the control system including a controller configured to determine a desired position of the fluid supply system based on a position signal to be provided to the substrate stage and a position offset, the position offset added to the position signal to be provided to the substrate stage.

20 Claims, 9 Drawing Sheets

U.S. PATENT DOCUMENTS

| | | | |
|---|---|---|---|
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,602,400 A | 2/1997 | Kawashima | |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,903,806 B2 | 6/2005 | Morisada | 355/72 |
| 7,184,121 B2 | 2/2007 | Van Der Meulen et al. | |
| 7,330,238 B2 * | 2/2008 | Van Der Toorn et al. | 355/53 |
| 7,352,434 B2 | 4/2008 | Streefkerk et al. | |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 * | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0030498 A1 | 2/2005 | Mulkens | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2005/0259233 A1 | 11/2005 | Streefkerk et al. | 355/53 |
| 2005/0270506 A1 | 12/2005 | Streefkerk et al. | 355/53 |
| 2006/0250596 A1 | 11/2006 | Nei et al. | 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 834 773 | 4/1998 |
| EP | 1039511 | 9/2000 |
| EP | 1 477 856 | 11/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002-203785 A | 7/2002 |
| JP | 2004-193252 | 7/2004 |
| JP | 2004-343114 A | 12/2004 |
| JP | 2004-343120 A | 12/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

European Search Report issued in EP 06 07 5656 dated Jun. 28, 2006.

Office Action in related Taiwanese application No. 095109551 mailed Feb. 10, 2010.

* cited by examiner

PRIOR ART

LITHOGRAPHIC APPARATUS, IMMERSION PROJECTION APPARATUS AND DEVICE MANUFACTURING METHOD

CROSS-REFERENCE TO RELATED APPLICATIONS

This application is a continuation of U.S. patent application Ser. No. 11/090,699 filed on Mar. 28, 2005, the content of which is hereby incorporated in its entirety by reference.

FIELD

The present invention relates to a lithographic apparatus, an immersion projection apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g., quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
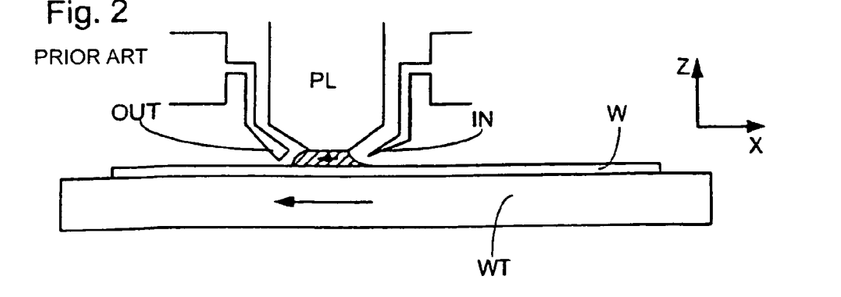
FIGS. 2 and 3 depict a liquid supply system used in a prior art lithographic projection apparatus.
Figure 3:
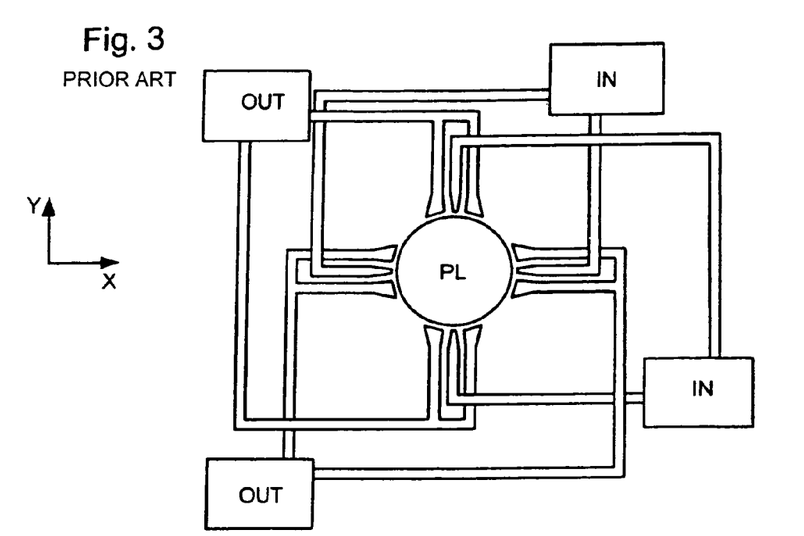

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, for example along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
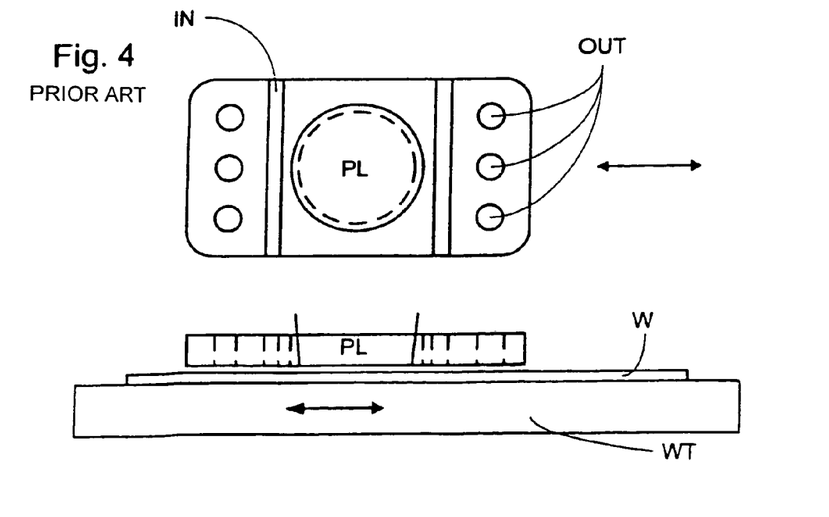
FIG. 4 depicts a liquid supply system according to another prior art lithographic projection apparatus.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. In certain embodiments, the seal is a contactless seal such as a gas seal. Such as system with a gas seal is disclosed in European Patent Application No. 03252955.4, hereby incorporated in its entirety by reference.

Figure 5:
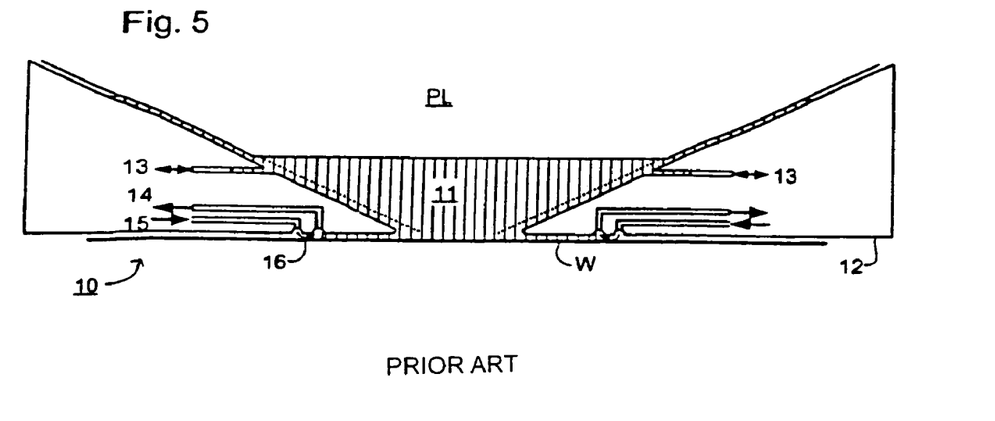
FIG. 5 depicts a liquid supply system according to still another prior art lithographic projection apparatus.

In yet another solution as depicted in FIG. 5, a reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, for example, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g., air or synthetic air and in certain cases, $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity air flow inwards that confines the liquid.

In European Patent Application No. 03257072.3, the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

According to the state of the art, the liquid supply system may be guided with respect to the substrate by way of an air bearing. The air bearing provides for a guiding of the liquid supply system with respect to the substrate, and for a distance between a surface of the substrate and the liquid supply system, or at least the reservoir thereof.

An alternative known in the art is to position the liquid supply system by way of an actuator instead of the guiding by an air bearing. The actuator is commonly driven by a control device providing for a positioning of the liquid supply system. In operation, the substrate is positioned such that its surface is kept in a focus plane of the projection system of the lithographic apparatus. Hence, according to the state of the art the liquid supply is positioned at a certain height with respect to the focus plane, to leave a predetermined gap between the liquid supply system (or at least the reservoir thereof) and the focus plane. As the substrate is positioned such that its surface coincides as good as possible with the focus plane, this will result in a distance between the surface of the substrate and the liquid supply system or at least the reservoir thereof, which is substantially equal to the gap between the focus plane and the liquid supply system (or reservoir thereof).

A problem associated with the positioning of the liquid supply system as described above occurs because of an unflatness of the substrate. To cope with unflatness of the substrate, the substrate table and positioning system thereof is according to the state of the art constructed to tilt the substrate table as to keep a part of the substrate which is to be illuminated at a certain moment locally in focus, thus locally coinciding as good as possible with the focus plane of the projection system. Dimensions of the liquid supply system are however significantly larger than a target portion of the substrate which is to be irradiated by way of the projection system. As a result thereof, a distance between an edge of the liquid supply system and the surface of the substrate may vary significantly, in practical implementations a variation in an order of magnitude of 30 micrometers having been observed. Such a variation in distance between the liquid supply system and the surface of the substrate may result in a crash of the liquid supply system against the substrate or may result in a too large distance causing leakage of the immersion liquid.

In addition to the above adverse effects, a further problem will occur at an edge of the substrate. In common state of the art implementations, the substrate, when being positioned on the substrate table, is surrounded by a structure which may comprise sensors, closing discs, etc. As explained above, a dimension of the liquid supply system may be significantly larger than a dimension of the target portion of the substrate, which is to be irradiated at a certain moment in time. Thus, when a portion of the substrate is to be irradiated, which is near an edge thereof, the liquid supply system will partly overlap with the structure(s) surrounding the substrate when positioned on the substrate table. A tolerance in the thickness of the substrate may thus result in a height difference between the surrounding structure and the surface of the substrate, hence resulting in a distance between the surrounding structure and the liquid supply system which may be larger or smaller than a distance between the target portion of the substrate which is to be irradiated and the liquid supply system. Similarly to the distance deviation as described above this may result in crashes in case of a distance which is too small or leakage of the immersion liquid in case the distance is too large.

SUMMARY

It is desirable to provide an improved positioning for the liquid supply system.

According to an aspect of the invention, there is provided a lithographic apparatus including a substrate table constructed to hold a substrate, a projection system configured to project a patterned radiation beam onto a target portion of the substrate, a fluid supply system which is constructed to supply a fluid between the substrate and a downstream end of the projection system, and a position controller to control a position of the fluid supply system, a position quantity of the substrate being provided to the position controller, wherein the position controller is arranged to determine a desired position of the liquid supply system by adding a position offset to the position quantity of the substrate, and position the liquid supply system according to the desired position.

According to an aspect of the invention, there is provided an immersion projection apparatus to project a beam onto a substrate, including a substrate table constructed to hold the substrate, a projection system configured to project a radiation beam onto a target portion of the substrate, a fluid supply system which is constructed to supply a fluid between the substrate and a downstream end of the projection system, and a position controller to control a position of the fluid supply system, a position quantity of the substrate being provided to the position controller, wherein the position controller is arranged to determine a desired position of the liquid supply system by adding a position offset to the position quantity of the substrate, and position the liquid supply system according to the desired position.

According to an aspect of the invention, there is provided a device manufacturing method including projecting by a projection system a patterned radiation beam onto a target portion of a substrate, supplying by a fluid supply system a fluid between the substrate and a downstream end of the projection system, and controlling a position of the fluid supply system, wherein the method further includes obtaining a position quantity of the substrate, determining a desired position of the liquid supply system by adding a position offset to the position quantity of the substrate, and positioning the liquid supply system according to the desired position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
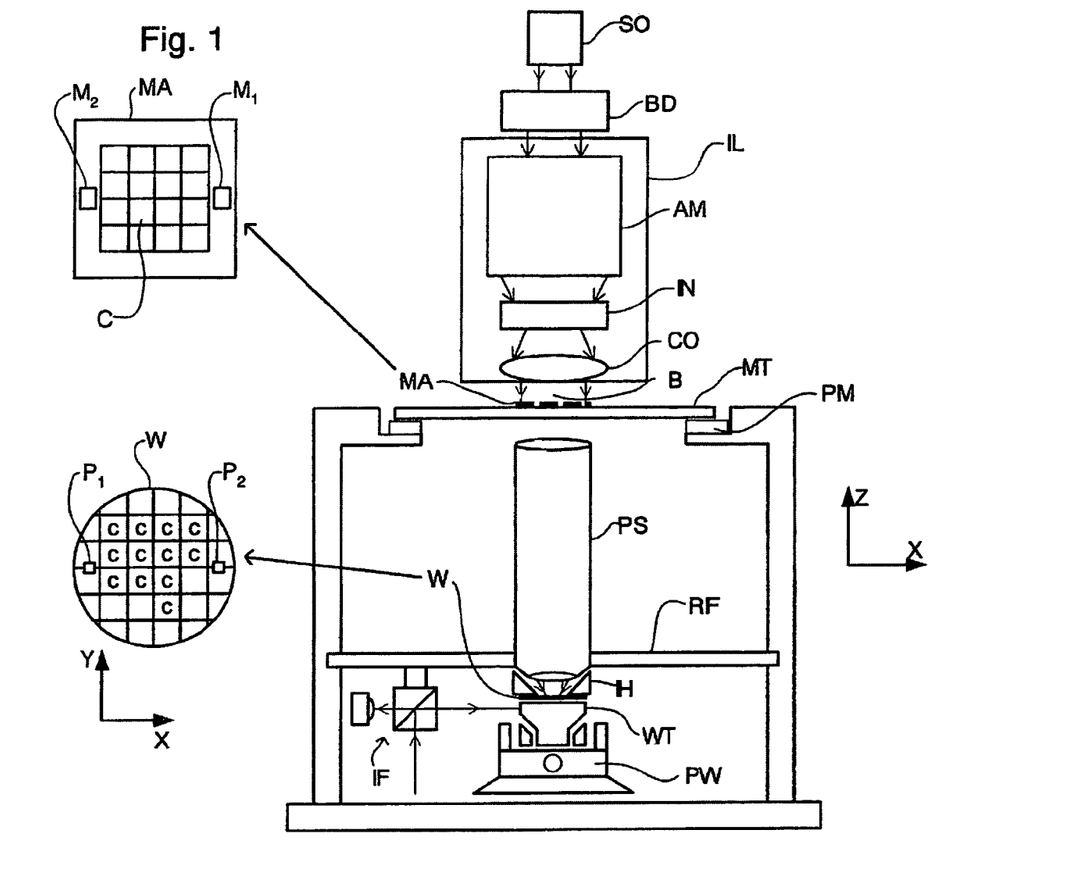
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g., UV radiation or DUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD (not shown) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 6:
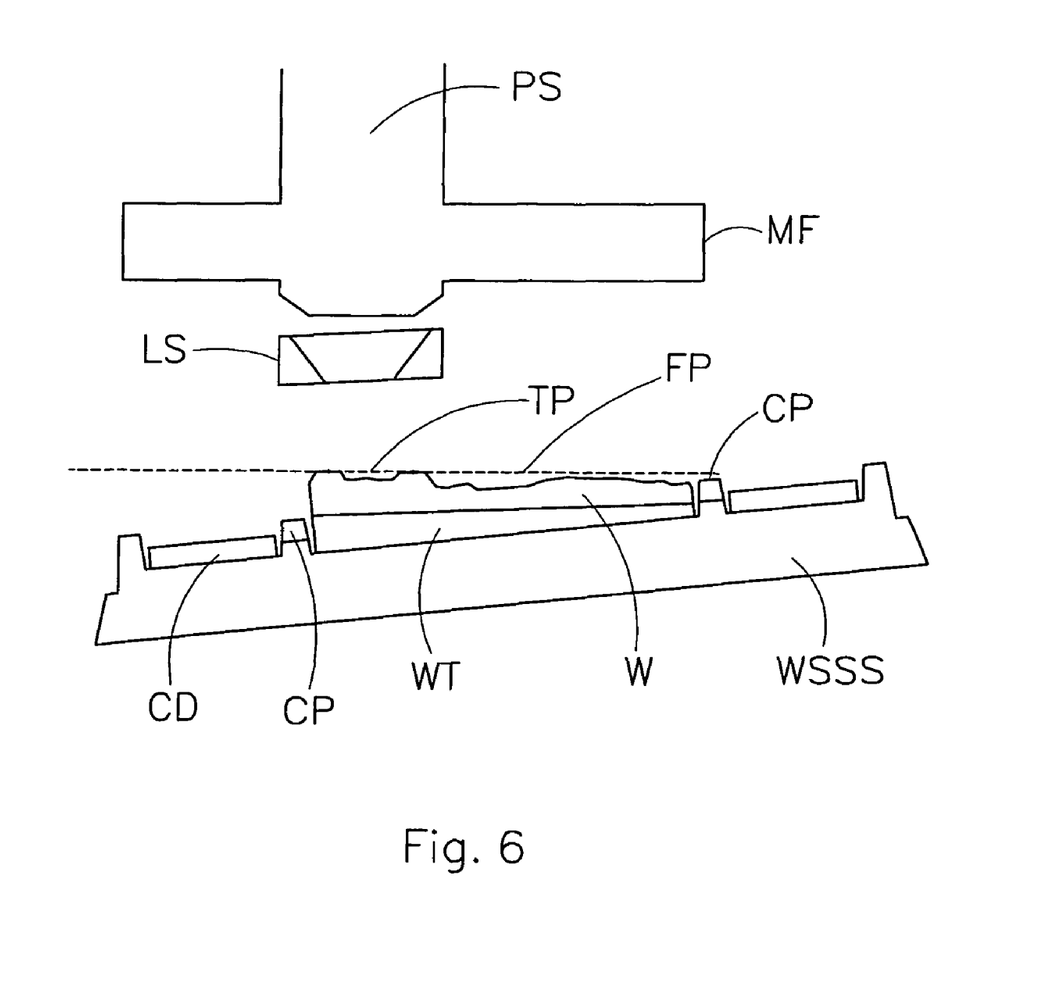
FIG. 6 depicts a substrate table and liquid supply system of a lithographic apparatus according to the invention.

FIG. 6 depicts a detailed view of a part of the lithographic apparatus according to the invention. In particular, FIG. 6 schematically depicts a part of the projection system PS, a metrology frame MF (which serves as a mechanical reference), the liquid supply system, indicated here as LS, a substrate W held by substrate table WT, and a wafer stage short stroke structure indicated as WS-SS. A surrounding structure of the substrate W is formed by a cover plate CP, which covers a gap between the substrate W and other surrounding elements, such as a TIS (Transmission Image Sensor) sensor, a closing disc CD, etc. The substrate W is positioned such that a target portion TP of a surface thereof is illuminated via the projection system PS. The liquid supply system LS provides for an immersion liquid between the projection system PS (more precisely a final projection lens of the projection system PS) and a part of the surface of the substrate W. It is to be noted that FIG. 6 is not drawn to scale and provides a schematic presentation only. Therefore, distances between the various elements as well as proportions thereof may not correspond to a physical reality. Further, it is remarked that although in the above description a liquid supply system LS has been mentioned, in general such liquid supply system could supply any type of fluid, thus including a liquid as well as a gas, thus the liquid supply system could, speaking in more general terms, also be identified as a fluid supply system. Consequently, instead of an immersion liquid as referred to in this document, any suitable fluid thus comprising a liquid as well as a gas, could be applied.

As explained above, the substrate table WT is positioned so as to position the target portion TP of the substrate W such that it coincides with a focus plane of the projection system PS as good as possible. In accordance with an embodiment of the invention, the liquid supply system is, as depicted in FIG. 6, tilted with respect to the projection system to follow a tilting of the substrate table WT, and thus of the substrate W. As the liquid supply system LS is tilted in this advantageous embodiment to follow tilting of the substrate table WT, a gap between the surface of the substrate W and the liquid supply system LS can be kept sufficiently constant so as to avoid a too large gap at one side of the liquid supply system which may result in leakage while simultaneously avoiding a too small gap at the other side of the liquid supply system which may result in a crash between the liquid supply system and the substrate. According to the invention, other or further criteria for positioning the liquid supply system may be applied in addition to or instead of the tilting. Examples thereof will be described in the below.

The operation of the lithographic apparatus according to the invention will now be described with reference to FIG. 7.

Figure 7:
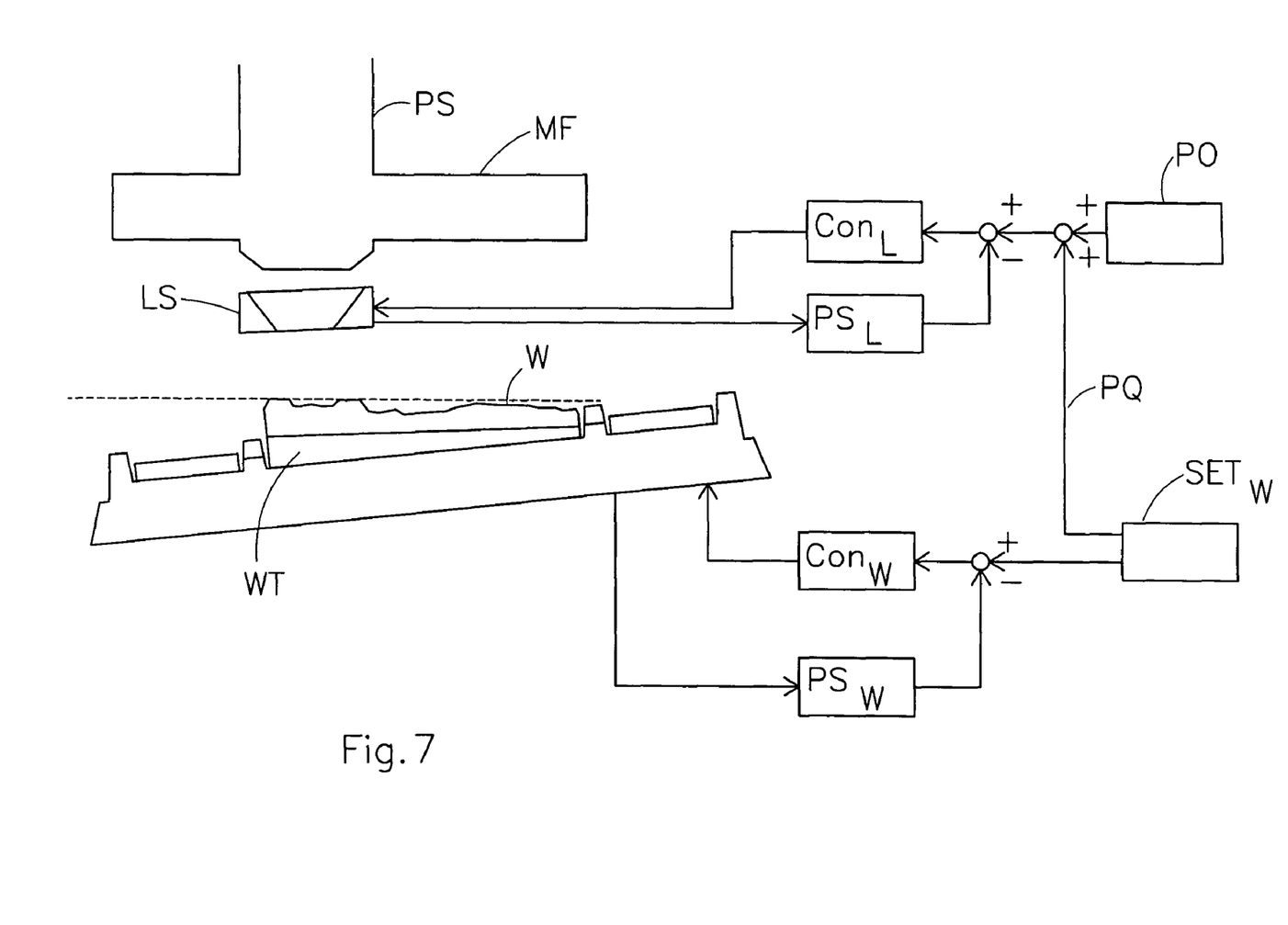
FIG. 7 depicts the substrate table and liquid supply system and a highly schematic diagram of the control device to position the liquid supply system according to the invention.

FIG. 7 highly schematically shows the projection system PS, liquid supply system LS, substrate W and substrate table WT, which may be identical to the one's depicted and described with reference to FIG. 6. The position of the substrate table WT, or more precisely in some embodiments the position of the substrate table short stroke WS-SS relative to, e.g., the metrology frame MF or the projection system PS is controlled by a position control loop comprising a position sensor $PS_L$ to sense a position of the substrate table WT and a substrate table position controller $CON_W$ to drive an actuator (not shown) to position the substrate. The controller $CON_W$ and the position sensor $PS_L$ in this embodiment form a close loop control loop. A position setpoint $SET_W$ is provided to the control loop thus providing a setpoint, i.e., a desired position for the substrate table WT. The position setpoint may have been determined in an advantageous embodiment by determining a level (height) map of the substrate W, thus measuring a height of the substrate W at a plurality of positions thereof. The height map can now be used to determine a suitable setpoint for positioning the substrate W to be able to match a position of the target portion of the substrate which is to be irradiated as good as possible with the focus plane of the projection system PS. This positioning of the substrate W may involve a translation in a vertical direction, e.g., a z-direction (indicated in FIG. 7), and/or may involve a tilting of the substrate w.r.t. in a plane perpendicular thereto, thus w.r.t. a plane which is advantageously substantially parallel to a focus plane of the projection system and/or around an axis perpendicular to an optical axis of the projection system. FIG. 7 further shows a position controller to control a position of the liquid supply system. The position controller comprises in this embodiment a position sensor $PS_L$ to determine a position of the liquid supply system and a controller $CON_L$ to drive an actuator (not shown) to position the liquid supply system. The position sensor $PS_L$ and the controller $CON_L$ which are comprised in this advantageous embodiment of the position controller according to the invention in this embodiment form a close loop control loop. According to the invention a setpoint, thus a desired position of the liquid supply system is determined by adding an offset to a position quantity of the substrate. The position offset is in FIG. 7 schematically indicated by PO. The position offset is added to the position quantity PQ which is provided by the setpoint generator to generate the setpoint $SET_w$ for the substrate table. The position quantity may comprise a tilting of the substrate or substrate table, the tilting, e.g., being with respect to the focus plane of the projection system. Advantages of such tilting have been described above. Further, the position quantity PQ of the substrate table may comprise a position of the substrate table in a direction perpendicular to the focus plane of the projection system, thus in a Z-direction. This may be useful for some measurements and/or irradiations in which the substrate table is moved in operation in a direction which at least partly coincides with the said axis, e.g., to bring the surface of the substrate out of focus for some measurements and avoiding a too large or too small gap between the liquid supply system LS and the substrate W. The offset may comprise a displacement (e.g., in a direction substantially perpendicular to the focus plane of the projection system), however may also comprise any tilting. In case that the offset comprises, e.g., a displacement, the position quantity of the substrate may comprise a position as well as a tilting, thus the liquid supply system may be positioned according to an aspect of the invention such that is offset in, e.g., a vertical (e.g., a Z-direction) with respect to the substrate while following a tilting of the substrate, hence obtaining the advantageous effects as described with reference to FIG. 6.

In an embodiment, the position offset comprises a substantially fixed offset value during a scan of the substrate, thus providing for an accurate following by the liquid supply system LS of the surface of the substrate W, while at the same time preventing complex calculations for position dependent offsets etc. The substantially fixed offset value may comprise a substantially fixed offset value in the Z-direction, thus advantageously in the direction perpendicular to the focus plane of the projection system, thus ensuring a fixed, predetermined gap between the liquid supply system and the substrate. This advantageous embodiment is advantageously combined with the position quantity comprising the rotational position, thus providing for an offset in the Z-direction, thus a gap in Z-direction, while following a tilting of the substrate table by the liquid supply system; thus resulting in not only a fixed difference averaged over a surface of a portion of the substrate which faces the liquid supply system, but also eliminates as much as possible differences in the gap at edges of the liquid supply system. In other words, the position quantity comprises the rotational positions around the X and Y axes being perpendicular to the Z axis; while keeping the Z axis itself fixed. Thus, the distance between the surface of a portion of the substrate which faces the liquid supply system and the liquid supply system is kept constant in Z-direction, while the substrate table tilting is followed by the liquid supply system. This way, local tilt variations on the wafer do not result in gap variations at the edges of the liquid supply system. The relative Z-distance between liquid supply system and substrate is be kept constant and only the large (average) global Rx/Ry tilt of the substrate is followed by the liquid supply system. Small slit related, but high frequent substrate topology is not tracked by the liquid supply system, because this would result in to large gap variations of liquid supply system (ca. 100×100) that has much larger dimensions than the slit (ca. 20*32 mm).

In the advantageous embodiment wherein the projection offset comprises the substantially fixed offset value during the scan of the substrate, it is further possible that the substantially fixed offset value is determined for a substrate by adding at least a part of a thickness parameter of the substrate to a nominal offset value. In this way, a compensation is provided when the position quantity also comprises the position of the substrate table in the Z-direction, as in that case a thicker substrate would result in a lower setpoint for the substrate table and thus in a smaller gap between the liquid supply system and the substrate table. To compensate for this effect, at least a part of the thickness parameter of the substrate may be added to the nominal offset value, thus in case of a thicker substrate, e.g., increasing the offset in the Z-direction, while in case of a thinner substrate decreasing the offset. This advantageous embodiment does result in a more equal gap between the liquid supply system and the substrate for a thick substrate as well as for a thin substrate. The thickness parameter of the substrate comprises in a practical embodiment a mean value, e.g., an average value, of a maximum and a minimum thickness of the substrate.

The position controller may be arranged to keep the fluid supply system at a fixed position during a scan of the substrate. In this advantageous embodiment, the position quantity of the substrate may comprise an average position of the substrate table in the direction perpendicular to the focus plane of the projection system, thus in the Z-direction. An advantage is that the liquid supply system during a scan does not move with respect to the projection system. Therefore, no disturbing forces by a movement of the liquid supply system will be transferred to the projection system and to and reference to which the projection system may be connected, such as the metrology frame. Thus, any position inaccuracies and projection inaccuracies by such disturbing forces may be avoided. A further advantage is that no or only limited forces act on the metrology frame MF as a result of displacements of the liquid supply system during the scan. In a practical embodiment the actuator or actuators to position the liquid supply system may act with reference to the metrology frame MF thus causing reactive forces to the metrology frame MF when displacing the liquid supply system or otherwise actuating the actuators.

The position controller is in a further advantageous embodiment configured to determine a momentary distance between a lower edge of the liquid supply system and a surface of the substrate. Further, the position controller is in this embodiment configured to temporarily adjust the offset when the distance reaches an extreme of a predetermined desired distance range. The desired distance range may be set so as to certify a minimum distance which provides a minimum safety distance between the liquid supply system and the substrate while certifying a maximum distance which does not exceed a distance (and thus a gap between the liquid supply system and the substrate) which exceeds a value which could potentially lead to problems such as leakage, etc. The momentary distance may be determined with any kind of distance measuring device, in an embodiment, the momentary distance is determined from a difference between a position of the substrate or the substrate table and a position of the liquid supply system. In this manner, a simple position controller can be implemented as the position controller in this embodiment is only required to adjust the offset when the distance reaches an extreme of the predetermined desired range.

In another advantageous embodiment, the position controller is configured to determine a distance between the liquid supply system and the substrate and to issue a warning message when the distance exceeds a predetermined safety distance range. The warning messages may comprise any type of message including a digital code in a computer network as well as any type of optical or acoustical warning or any other indication. Thus, a safety message is generated when a predetermined safety distance range is exceeded.

A further group of embodiments will be explained with reference to FIG. 8 and FIG. 9. In these embodiments, the positioned quantity comprises a height function of a substrate height. Such a height function may either consist of a table comprising a respective height for a respective position on the substrate, or the height function may comprise a mathematical function. The term height is to be understood as a level of a surface of the substrate as positioned on the substrate table in a direction substantially parallel to the Z axis as referred to above. The height function may have been determined in practical embodiments for each substrate anyway, as is required to determine an optimal position of the substrate table for positioning a target portion of the substrate such that it coincides with a focus plane of the projection systems as good as possible. In the below, some advantageous embodiments comprised in this group of embodiments will be discussed.

Figure 8A:
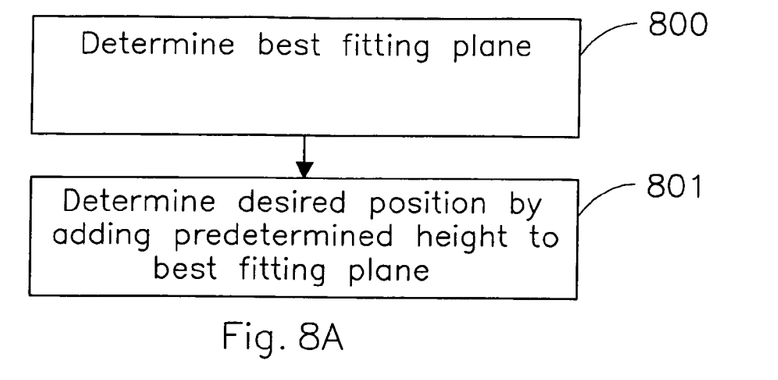
FIG. 8A-F depict flow diagrams of embodiments of the lithographic apparatus, method and projection apparatus according to the invention.

As depicted in FIG. 8A, in an embodiment the position controller is configured to determine in step 800 by way of the height function a best fitting plane over a part of the substrate surface which is covered by the liquid supply system. Then, in step 801 the desired position of the liquid supply system is determined by adding a predetermined height to the height of the best fitting plane. The predetermined height may comprise any offset advantageously it comprises a height offset which corresponds to an optimum height in case that the surface of the substrate would be completely flat which height may be in a range of 30-150 micrometers. In this manner, a gap between the liquid supply system and the substrate is kept constant at such optimal value as well as possible. This embodiment is further graphically depicted in FIG. 9A where LS represents the liquid supply system, W represents a surface of the substrate and WBF represents the best fitting plane for the substrate surface.

It is noted that in the embodiments as described with reference to any of FIGS. 8A-8F, as well as may be the case for any other embodiment described in this document, the term height or height difference is to be understood as a position or position difference along an axis which is substantially perpendicular to the focus plane of the projection system. Further, it is noted that not only the height of the best fitting plane may be determined and used, but also a local tilt of the best fitting plane. This may not only be applicable for the FIG. 8A embodiments, but may be applicable for other embodiments also, in particular but not limited to the FIG. 8B-8F embodiments.

Figure 8B:
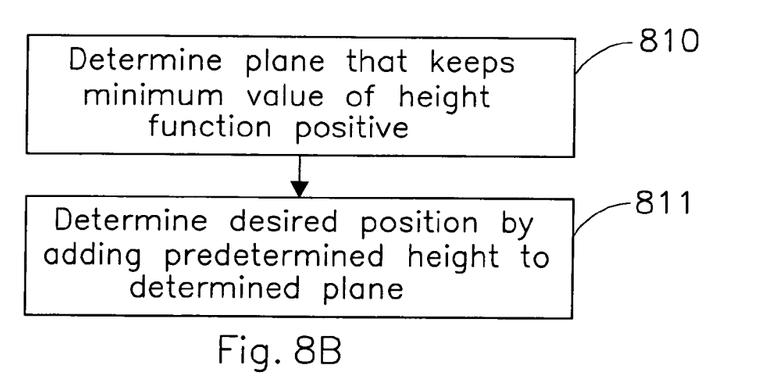

In an embodiment, the positioned controller is configured to determine in step 810 by way of the height function a plane that keeps a minimum value of the height function positive over the part of the substrate surface which is covered by the liquid supply system. Then, in step 811 a desired position of the liquid supply system is determined by adding the predetermined height to the plane that keeps the minimum value of the height function positive. Thus a calculation similar to the calculation of the above embodiment as described with reference to FIG. 8A is performed, but instead of the best fitting plane, a plane is calculated that keeps the minimum value of the height function positive hence resulting in a position that maintains at least a minimum gap, thus a minimum distance between the liquid supply system and the surface of the substrate. This embodiment is graphically depicted in FIG. 9B, where WPOS expresses the plane which is calculated for which the minimum value of the height function is positive.

Figure 8C:
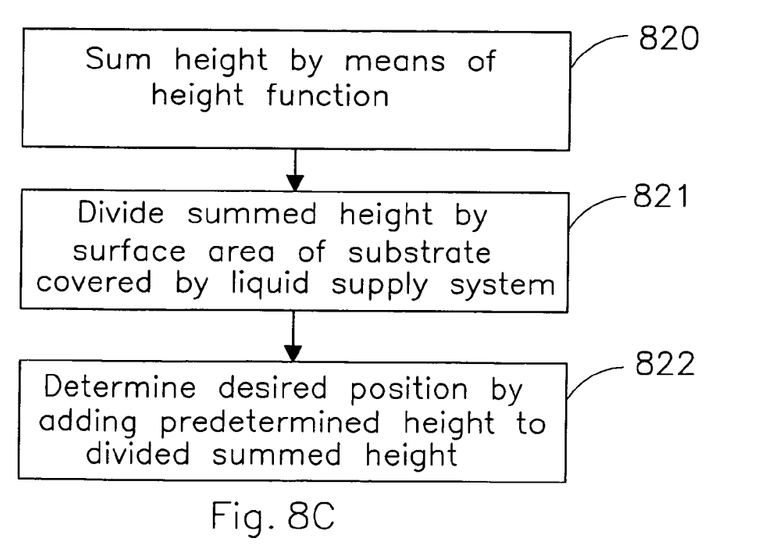
Figure 8D:
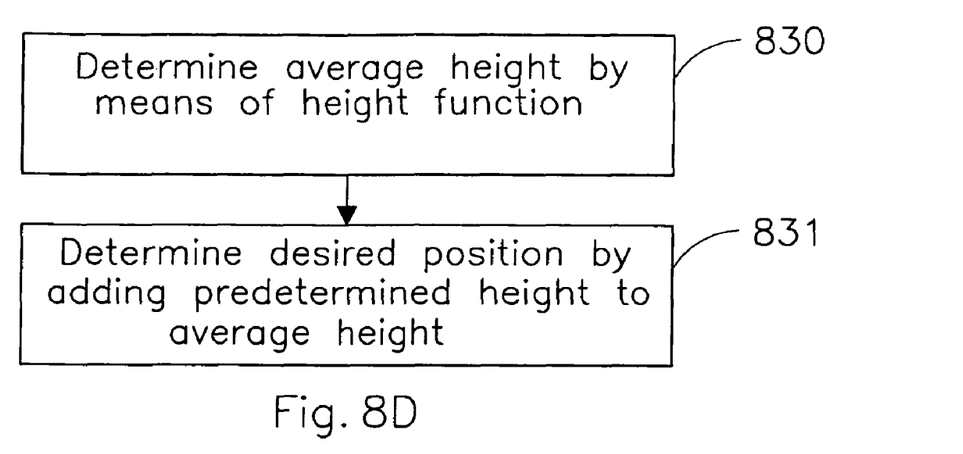

In an embodiment, as depicted in FIG. 8C, the positioned controller is configured to in step 820 by way of the height function a height over the part of the substrate surface which is covered by the liquid supply system; divide in step 821 the summed height by a surface area of the part of the substrate surface which is covered by the liquid supply system to obtain a divided summed height; and determine in step 822 the desired position of the liquid supply system by adding the predetermined height to the divided summed height. As a result, a constant volume is achieved. As an alternative to the summing of the height, it is also possible to perform an integration. With this embodiment, the position and orientation of the liquid supply system is determined that keeps a volume of the liquid in the gap between the liquid supply system and the substrate substantially constant. In a further embodiment, as described with reference to FIG. 8D, the positioned controller is configured to determine in step 830 by way of the height function an average height over a part of the substrate surface which is covered by the liquid supply system; and determine in step 831 the desired position of the liquid supply system by adding a predetermined height to the average height. As a result a minimum normal squeezing is achieved thus keeping the volume contained in the gap constant while neglecting a tilt. This embodiment is further illustrated in FIG. 8D.

Figure 8E:
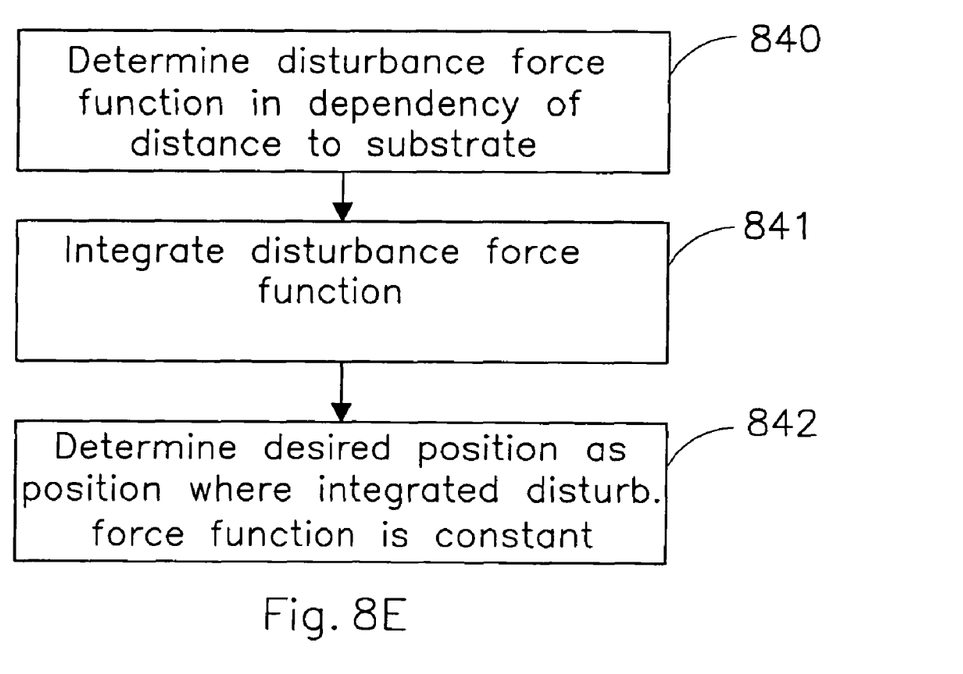

In an embodiment as depicted in FIG. 8E, the position controller is configured to determine in step 840 a disturbance force function over the part of the substrate surface which is covered by the liquid supply system, the disturbance force function representing a force between the substrate and the liquid supply system in dependency on a distance between the substrate and the liquid supply system; integrate in step 841, making use of the height function, the disturbance force function over the part of the substrate surface which is covered by the liquid supply system; and determine in step 842 the desired position of the liquid supply system as a position where the integrated disturbance force function over the part of the substrate surface which is covered by the liquid supply system, may be constant over, e.g., an applicable are of horizontal displacements of the substrate with respect to the liquid supply system. With this embodiment a minimal substrate of substrate table disturbance force is obtained. The inventor has devised that the force between the substrate resp. substrate table and the liquid supply system is strongly non-linearly dependent on the distance between these parts, thus on the gap. Therefore, in the calculation as applied in this embodiment, these non-linear characteristics are taken into account.

Figure 8F:
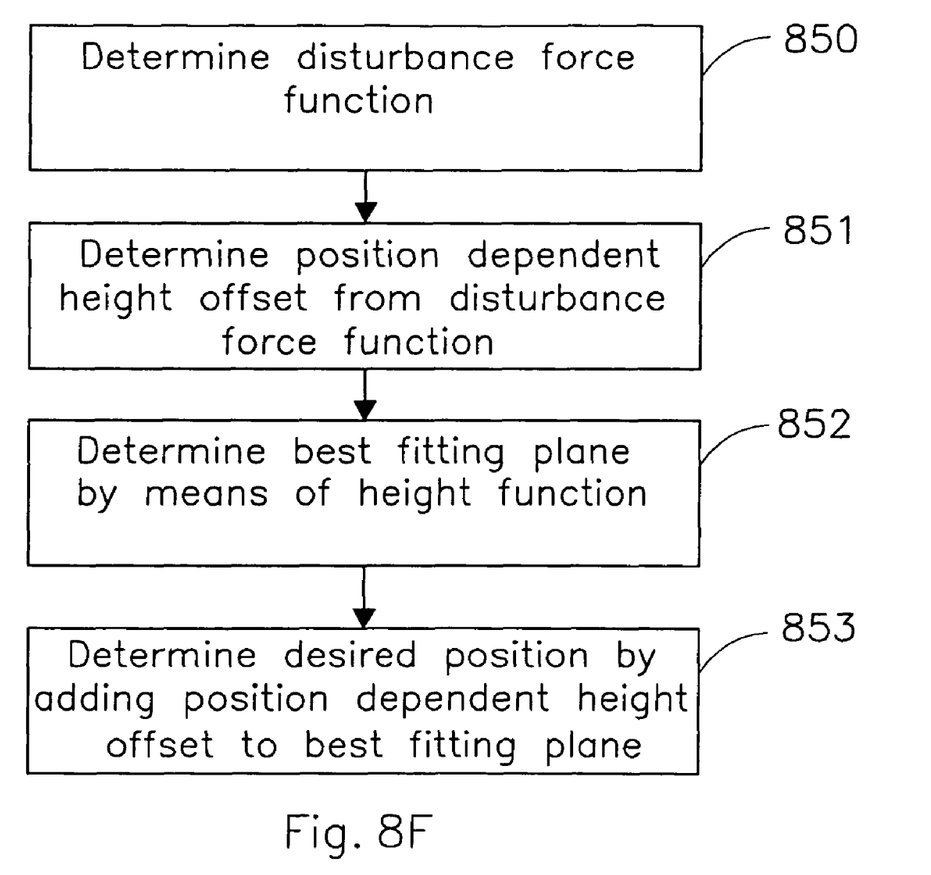
Figure 9A:
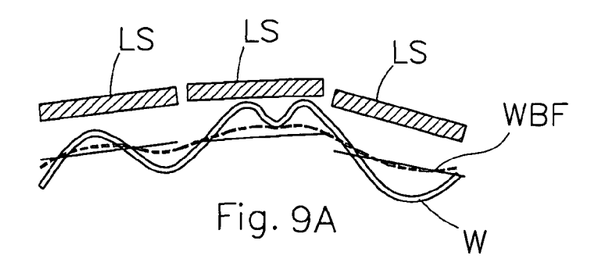
FIG. 9A-D depict examples according to the flow diagrams of FIGS. 8A-D.
Figure 9B:
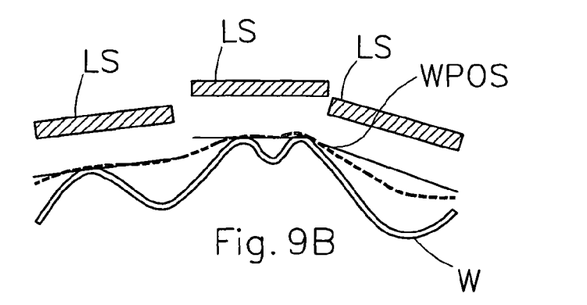
Figure 9C:
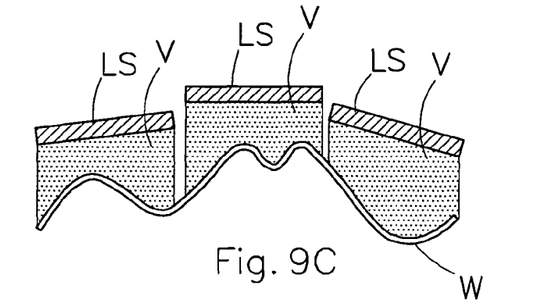
Figure 9D:
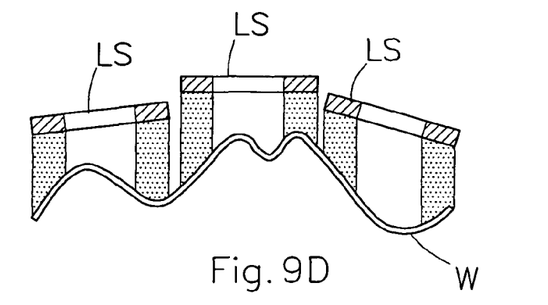

In a still further embodiment, as depicted in FIG. 8F, the position controller is configured to determine in step 850 the disturbance force function over the part of the substrate surface which is covered by the liquid supply system, the disturbance force function representing the force between the substrate and the liquid supply system in dependency on the distance between the substrate and the liquid supply system; determine in step 851 a position dependent height offset from the disturbance force function; determine in step 852 by way of the height function the best fitting plane over the part of the substrate surface which is covered by the liquid supply system; and determine in step 853 the desired position of the liquid supply system by adding the position dependent height offset to the height of the best fitting plane. In this embodiment, a minimum acceleration force is obtained. For the liquid supply system to follow a non-flat substrate table, or a non-flat height profile, a force on the liquid supply system is required to accelerate it. In this embodiment, an actuator force is reduced as a single value vector is used for the liquid supply system position or position map. The liquid supply systems is thus required to follow a displacement of the substrate and/or the substrate table.

In the embodiments as described with reference to FIGS. 8A-8F, the desired position is calculated for a plurality of positions of the substrate with respect to the projection system, thus resulting in a plurality of positions which might be expressed in a form of a table, a function, a level map, etc. The desired position might be calculated for discrete position steps of the substrate table, however might also be expressed in terms of a continuous function. The desired position in the embodiments described with reference to FIGS. 8A-8F may comprise a position and/or a tilt of the liquid supply system.

In this document, the term position controller may refer to any type of controller comprising, e.g., a microcomputer, microprocessor, or any other type of digital processing device provided with suitable software instructions. Further, the position controller may comprise dedicated hardware such as dedicated electronics to perform the said functions.

Further, in this document the term position quantity of the substrate may comprise any position related quantity comprising, e.g., a portion, a velocity, an acceleration of the substrate and/or the substrate table, a tilting, angular velocity or angular acceleration of the substrate and/or the substrate table. The position quantity may be with respect to any suitable reference, e.g., the projection system, the focus plane of the projection system, the metrology frame or any other fixed or movable reference of the projection system. The reference may be tangible (i.e., comprising a physical structure) or comprise any mathematical or optical reference, such as the focus plane.

Likewise, the desired position of the liquid supply system may comprise a position with respect to any reference and/or a tilting with respect to any reference.

The desired position may be determined in full or partly before commencement of an exposure of the substrate, however may also be determined in part or in full "on-the-fly," i.e., during exposure and/or movement of the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm).

The term "lens," where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The present invention can be applied to any immersion lithography apparatus, in particular, but not exclusively, those types mentioned above.

The descriptions above are intended to be illustrative, not limiting. Thus, it will be apparent to one skilled in the art that modifications may be made to the invention as described without departing from the scope of the claims set out below.

The invention claimed is:

1. A control system configured to control a position of a fluid supply system, the fluid supply system constructed and arranged to supply a fluid between a substrate and a projection system, the substrate positioned with a substrate stage, the control system comprising:
    a controller configured to determine a desired position of the fluid supply system based on a position signal to be provided to the substrate stage and a position offset, the position offset added to the position signal to be provided to the substrate stage.

2. The control system of claim 1, further comprising an actuator configured to position the fluid supply system according to the desired position determined by the controller.

3. The control system of claim 1, further comprising a sensor configured to sense a position of the fluid supply system, the sensed position of the fluid supply inputted to the controller to determine the desired position of the fluid supply system.

4. The control system of claim 1, wherein the position signal is provided by a set point generator, the position signal provided to a substrate controller that is configured to control a position of the substrate stage.

5. The control system of claim 4, wherein the substrate stage includes a short stroke actuator.

6. The control system of claim 1, wherein the position signal comprises a signal related to a tilt of a substrate table with respect to a focus plane of the projection system, the substrate table included in the substrate stage and configured to hold the substrate.

7. The control system of claim 1, wherein the position signal comprises a signal representative of a position of a substrate table in a direction perpendicular to a focus plane of the projection system, the substrate table included in the substrate stage and configured to hold the substrate.

8. The control system of claim 1, wherein the position offset comprises a substantially fixed offset value during a scan of the substrate.

9. The control system of claim 1, wherein the controller is further configured to determine a momentary distance between the liquid supply system and the substrate, and to temporarily adjust the offset when the distance reaches an extreme of a predetermined desired distance range.

10. The control system of claim 1, wherein the controller is further configured to determine a distance between the liquid supply system and the substrate and to issue a warning message when the distance exceeds a predetermined safety distance range.

11. The control system of claim 1, wherein the position signal comprises a height function of a substrate height.

12. The control system of claim 11, wherein the controller is configured to:
    determine by way of the height function a best fitting plane over a part of the substrate surface which is covered by the liquid supply system; and determine the desired position of the liquid supply system by adding a predetermined height to the height of the best fitting plane.

13. The control system of claim 11, wherein the controller is configured to:
   determine by way of the height function a plane that keeps a minimum value of the height function positive over the part of the substrate surface which is covered by the fluid supply system; and
   determine a desired position of the fluid supply system by adding the predetermined height to the plane that keeps the minimum value of the height function positive.

14. The control system of claim 11, wherein the controller is configured to:
   sum by way of the height function a height over the part of the substrate surface which is covered by the fluid supply system;
   divide the summed height by a surface area of the part of the substrate surface which is covered by the fluid supply system to obtain a divided summed height; and
   determine the desired position of the fluid supply system by adding the predetermined height to the divided summed height.

15. The control system of claim 11, wherein the controller is configured to:
   determine by way of the height function an average height over a part of the substrate surface which is covered by the fluid supply system; and
   determine the desired position of the fluid supply system by adding a predetermined height to the average height.

16. The control system of claim 11, wherein the controller is configured to:
   determine a disturbance force function over the part of the substrate surface which is covered by the fluid supply system, the disturbance force function representing a force between the substrate and the fluid supply system in dependency on a distance between the substrate and the fluid supply system;
   integrate, making use of the height function, the disturbance force function over the part of the substrate surface which is covered by the fluid supply system; and
   determine the desired position of the fluid supply system as a position where the integrated disturbance force function over the part of the substrate surface which is covered by the fluid supply system, is substantially constant.

17. The control system of claim 11, wherein the controller is configured to:
   determine the disturbance force function over the part of the substrate surface which is covered by the fluid supply system, the disturbance force function representing the force between the substrate and the fluid supply system in dependency on the distance between the substrate and the fluid supply system;
   determine a position dependent height offset from the disturbance force function;
   determine by way of the height function the best fitting plane over the part of the substrate surface which is covered by the fluid supply system; and
   determine the desired position of the fluid supply system by adding the position dependent height offset to the height of the best fitting plane.

18. The control system of claim 1, wherein the position offset and the position signal to be provided to the substrate stage are both received by the controller.

19. A method of controlling a position of a fluid supply system constructed and arranged to supply a fluid between a substrate and a projection system, the substrate positioned with a substrate stage, the method comprising:
   determining a desired position of the fluid supply system by adding a position offset to a position signal to be provided to the substrate stage; and
   positioning the fluid supply system according to the desired position.

20. The method of claim 19, wherein the desired position is determined by a controller and wherein the position offset and the position signal to be provided to the substrate stage are both received by the controller.

* * * * *